US007666485B2

(12) United States Patent
Lal et al.

(10) Patent No.: US 7,666,485 B2
(45) Date of Patent: Feb. 23, 2010

(54) ALKALI METAL-WAX MICROPACKETS FOR ALKALI METAL HANDLING

(75) Inventors: Amit Lal, Ithaca, NY (US); Shankar Radhakrishnan, Ithaca, NY (US)

(73) Assignee: Cornell University, Ithaca, NY (US)

( * ) Notice: Subject to any disclaimer, the term of this patent is extended or adjusted under 35 U.S.C. 154(b) by 459 days.

(21) Appl. No.: 11/447,201

(22) Filed: Jun. 6, 2006

(65) Prior Publication Data

US 2007/0034809 A1 Feb. 15, 2007

Related U.S. Application Data

(60) Provisional application No. 60/687,306, filed on Jun. 6, 2005.

(51) Int. Cl.

| | |
|---|---|
| ***B29D 22/00*** | (2006.01) |
| ***B32B 3/10*** | (2006.01) |
| ***H01S 3/22*** | (2006.01) |
| ***H03B 17/00*** | (2006.01) |

(52) U.S. Cl. .......................... 428/34.1; 428/44; 428/46; 428/542.8; 331/94.1; 372/55

(58) Field of Classification Search ................ 331/94.1; 372/39, 55; 428/34.1, 44, 46, 542.8, 543
See application file for complete search history.

(56) References Cited

U.S. PATENT DOCUMENTS 6,255,647 B1 * 7/2001 Vanier et al. ................ 250/251

* cited by examiner

*Primary Examiner*—David Mis
(74) *Attorney, Agent, or Firm*—Marjama Muldoon Blasiak & Sullivan LLP

(57) ABSTRACT

A method of making alkali-metal vapor cells by first forming microscale-wax micropackets with alkali metals inside allows fabrication of vapor cells at low cost and in a batch fabricated manner. Alkali metals are enclosed in a chemically inert wax to preform alkali metal-wax micropackets, keeping the alkali metals from reacting with the ambient surroundings during the vapor cell fabrication. This enables the deposition of precise amounts of pure alkali metal inside the vapor cells. Laser ablation of the alkali metal-wax micropackets provides a simple and effective way of releasing the enclosed metal. The method reduces the cost of making chip-scale atomic clocks and allows shipping of alkali vapor packets without contamination issues, thereby creating a technology for alkali-metal vendors to provide small packets of alkali metals.

20 Claims, 4 Drawing Sheets

Laser mounted on an X-Y stage ablates $Si_xN_y$ and the wax and finally releases Rb into the cell. (Table 1).

FIG. 1a

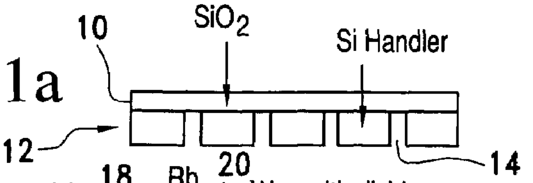

Grow $SiO_2$
DRIE etch holes

FIG. 1b

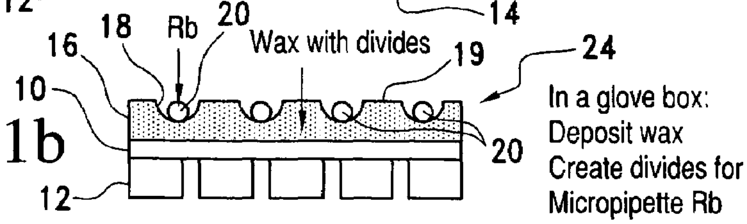

In a glove box:
Deposit wax
Create divides for Rb
Micropipette Rb

FIG. 1c

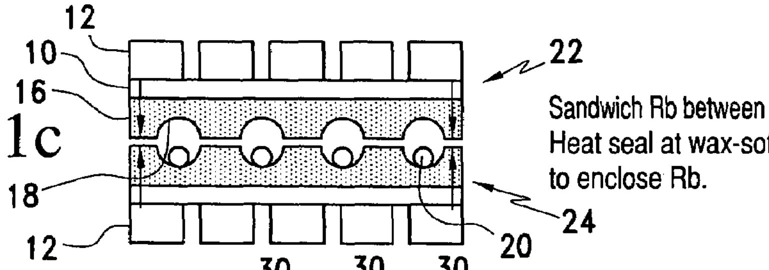

Sandwich Rb between two wax divide wafers
Heat seal at wax-softening temperature
to enclose Rb.

FIG. 1d

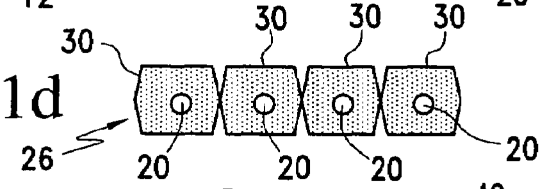

Release wax in HF
Dice to form Rb-Wax micropackets.

FIG. 2a

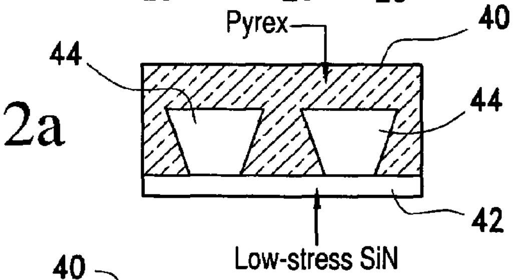

Form cavities in silicon substrate.
Anodic bond to Pyrex in vacuum
chamber with required buffer gas
pressure/composition

FIG. 2b

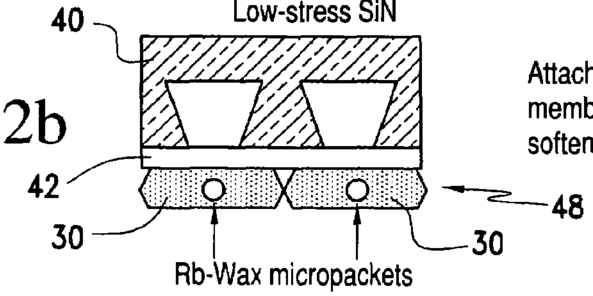

Attach wax-Rb micropackets on $Si_xN_y$
membranes by heating to wax
softening temperature.

FIG. 2c

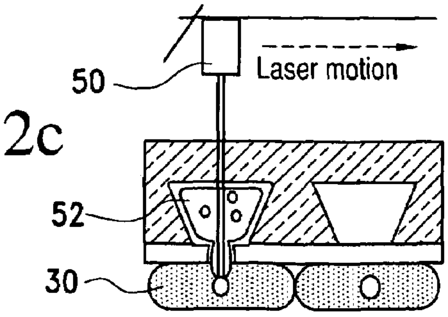

Laser mounted on an X-Y stage
ablates $Si_xN_y$ and the wax and finally
releases Rb into the cell. (Table 1).

ALKALI METAL-WAX MICROPACKETS FOR ALKALI METAL HANDLING

This application is a continuation of and claims priority to the filing date of U.S. provisional application Ser. No. 60/687,306, filed Jun. 6, 2005, the entire disclosure of which is hereby incorporated herein by reference. This application is also related to commonly owned U.S. provisional application Ser. No. 60/679,979, entitled RADIOACTIVE DECAY BASED STABLE TIME OR FREQUENCY REFERENCE SIGNAL SOURCE and filed May 12, 2005, the entire disclosure of which is also incorporated herein by reference.

The present invention was made at least partially with Government funds under DARPA Grant No. NBCH 1020005. The US Government may have rights in this patent.

BACKGROUND OF THE INVENTION

1. Field of the Invention

The present invention relates generally to a structure and method for fabrication of vapor cells adapted for use in making chip-scale atomic clocks (CSACs) via wafer-scale micromachining processes.

2. Discussion of the Prior Art

The need for more and more precise and stable time-keeping for a wide variety of applications has been on the rise, particularly in applications such as digital communications, global positioning systems (GPS) and, more critically, for security and identification applications such as friend-or-foe (IFF) communications.

There are a wide variety of potential applications for enhanced time or frequency reference signal sources, which may be referred to as time bases or clocks. One example of the need for precise, stable time keeping is found in the development of enhanced, jam-resistant GPS receivers. The signals broadcast by GPS satellites are extremely low in power, making the GPS receivers highly susceptible to intentional jamming signals as well as to unintentional interference from sources transmitting in the same frequency band. For example, some GPS signals are transmitted over a wide bandwidth, making them considerably less susceptible to jamming than normal GPS signals. Typically, however, these broadband signals incorporate a code that repeats only every seven days, so that broadband receivers usually have to first lock onto the normal signal, and this eliminates the anti-jam advantage of the larger-bandwidth signal. If the broadband receiver's local clock were capable of determining the time to within 1 millisecond (ms) over several days, its search for the GPS signals would be narrowed so the receiver could, theoretically, lock onto the broadband signal directly, without first having to acquire the normal signal. Thus, if a more accurate clock were available, the receiver would be significantly more resistant to jamming.

Three important characteristics are necessary to realize a 'good' time base or clock: (1) long and short-term frequency stability (usually measured in Allan variance and phase noise of the frequency source); (2) physical size of the clock; and (3) the power consumed by the clock. Historically (and mainly to satisfy criterion 1), clocks based on electromagnetic oscillations of atoms have provided the most precise method of timing events lasting longer than a few minutes. So precise are these "atomic" clocks, that in 1967 the second was redefined to be the duration required for a cesium (Cs) atom in a particular quantum state to undergo exactly 9,192,631,770 oscillations. While the long-term precision of atomic clocks is unsurpassed, the size and power required to run them has prevented their use in a variety of areas, particularly in those applications requiring portability or battery operation. The NIST F-1 primary standard, for example, occupies an entire table and consumes several hundred watts when operating. The state of the art in compact commercial atomic frequency references is rubidium (Rb) vapor-cell devices with volumes near 100 $cm^3$ operating on a few watts of power; such references cost about $1,000.00 USD.

Recently, miniature atomic clocks have been based on Microelectromechanical systems (MEMS) technology which offers advantages such as smaller size, an improvement in the device power usage due to reduced parasitic heat dissipation (as the heat lost to the environment via the device surface is smaller), and high-volume, wafer-based production methods, which may substantially reduce cost. In spite of these advantages, the power consumed by currently envisioned MEMS-based atomic clocks hasn't been reduced enough to permit their use in applications such as portable battery operated systems in long-term operations, including, for example, week-long missions for the military, months-long working of communication base units or even year/decade long operation for sensor node applications.

Prior art atomic clocks typically include a physics package, which is the heart of the clock and contains an atomic (usually Rb or Cs) vapor cell that acts as a frequency reference to determine the clock output frequency.

Solid state resonators (such as RF resonators based on quartz and silicon) are portable and energy efficient and so are often used in wrist watches and the like, but cannot provide an adequate reference signal because they have observable and random aging effects which cause their frequencies to shift in a non-predictable manner.

Stable frequency sources are extremely important for communication systems for civil and military applications, and for sensor stability for long-term operation of sensor nodes. Considerable work has been done in the last few years to realize miniaturized atomic clock systems or chip-scale atomic clocks (CSACs) demonstrating potential for portability and low power operation. Low operation power and size of the CSACs are required for portability, whereas good short and long-term stability and low cost of fabrication are essential to ensure applicability in a wide variety of markets.

The frequency stability of atomic clocks is based on transitions between the well-defined ground state hyperfine levels of alkali atoms such as rubidium (Rb) or cesium (Cs). The physics package of an atomic clock consists of alkali metal atoms enclosed in a vapor cell so that the atomic resonance is excited and interrogated by an RF local oscillator about a frequency that corresponds to the hyperfine energy difference in the ground state of atoms.

The vapor cells of CSACs use sealed micromachined cavities to enclose the highly reactive alkali metals (such as rubidium—Rb and cesium—Cs) in a buffer gas composition. In addition, since the size of the vapor cells are very small (of the order of $mm^3$), the buffer gas pressure and composition have to be optimized to serve the two important purposes of creating an inert ambient environment for the alkali metals, and maximizing the coherence lifetimes of the atoms by decreasing their effective wall relaxation., in turn reducing the linewidth of the hyperfine absorption.

The use of highly reactive and low melting alkali metals and filling the vapor cells with the optimum pressure and composition of buffer gases thus impose a MEMS packaging challenge. The fabrication of MEMS vapor cells so far has involved anodic bonding between micromachined silicon cavities and Pyrex glass. Since anodic bonding requires high-temperature (~400° C.) processing, whereas the melting points of alkali metals are much lower (Rb ~39.3° C., Cs ~28.4° C. at 1 atm), the alkali-metal and buffer gases cannot be placed inside the cavities before the bonding process reliably. Knappe, et al, have tried to solve this problem by in-situ fabrication of the alkali metals from high temperature reaction of metal hydrides, metal chlorides and/or metal hydroxides during bonding. This can lead to residual impurities that cause long term drifts of the hyperfine resonance frequency. Lee, et al, have demonstrated a method of interconnecting the cavities using micromachined channels, and parallel filling after vapor cell formation. However isolation of the cells from each other and dicing requires the use of a wax-sealing, which leads to low yield, and requires bulk rubidium delivery, which is inefficient and results in uncontrolled delivery of rubidium in each vapor cell.

An alternative to using buffer gas to increase the coherence life time is to use a thin and uniform (or monolayers) of wall coating of materials such as Teflon (used in hydrogen maser frequency references), long chain alkanes (such as n-tetracontane—a component of paraffin wax), or some alkynated silanes (used in alkali metal frequency standards), as reported by Frueholtzs, et al and Sagiv, et al. However, the stringent requirements for the quality and apparatus needed for formation of wall coating is currently not compatible with MEMS processing. Furthermore, alkylated silanes have been shown to degrade over long-term operations directly affecting the long-term stability of the atomic clock system.

There is a need, therefore, for a structure and method for reliable fabrication of vapor cells adapted for economical use in making chip-scale atomic clocks (CSACs) via wafer-scale micro-machining processes that overcomes the problems with the prior art.

SUMMARY OF THE INVENTION

An object of the present invention is to provide a structure and method for fabrication of vapor cells adapted for use in making chip-scale atomic clocks (CSACs) via wafer-scale micro-machining processes adapted to overcome the problems with the prior art.

Briefly, in accordance with the present invention, the applicants noted that no such adverse effects have been reported in connection with the use of long chain alkanes in atomic clock vapor cells. In this embodiment, chemically inert alkanes, particularly long chain alkanes (called n-paraffins) are used to enclose highly reactive Rb inside wax to make Rubidium-Wax micropackets to form vapor cells for CSACs. In accordance with the present invention, a method for fabricating vapor cells for chip-scale atomic clocks (CSACs) uses wafer-scale micromachining processes.

Alkali metals are enclosed in a chemically inert wax to preform alkali metal-wax micropackets, keeping the alkali metals from reacting with the ambient surroundings during the vapor cell fabrication. This enables the deposition of precise amounts of pure alkali metal inside the vapor cells. Laser ablation of the alkali metal-wax micropackets provides a simple and effective way of releasing the enclosed metal. Apart from the high level of purity of the alkali metals in the resulting vapor cells, this method holds promise for inexpensive and flexible manufacturing of vapor cells, as well as easy handling of alkali metals used for a variety of applications other than for CSACs.

The process for Alkali-Metal Wax Micropacket Fabrication, includes a sequence of steps; first, a 1 micrometer (μm) thick layer of silicon dioxide ($SiO_2$) is deposited on a 4-inch silicon wafer used as a handle substrate. Through-wafer holes are etched through the handle substrate using deep reactive ion etching (DRIE) on the back side to serve as etch holes for the release process.

A thin uniform layer of wax is deposited on top of the $SiO_2$ layer in the following way. The handling wafer is placed on a hotplate with a level surface inside a nitrogen ambience glove box with low levels of oxygen and humidity within a few parts per million. A measured amount of solid wax is placed on the wafer, melted and spread using a microscope glass slide. The wafer is held above the melting point for a few minutes and rapidly cooled to ensure a uniform thickness (~0.25 mm) of the resulting wax layer. An array of pins is poked down into in the wax layer to indent, impress or form wax dimples or divides by heating the wafer to the wax softening temperature. The pins or other indenting members define evenly spaced indentations or divides separated by sidewalls having a selected spacing and orientation.

Precise amounts of liquid $Rb^{87}$ are micro-pipetted onto the wax indentations or divides using an X-Y-stage and a syringe pump to define a selected number of individual liquid $Rb^{87}$ segments or balls.

A wax enclosure is then formed by enclosing or sandwiching the $Rb^{87}$ segments between upper and lower indented, wax-layered wafers. An upper indented, wax layered wafer assembly also comprises a substantially identical silicon dioxide ($SiO_2$) layer deposited on a 4-inch silicon handle wafer that has a plurality of evenly spaced through-wafer holes (or vents or vias) etched through using deep reactive ion etching (DRIE) on the back side to serve as etch holes for the release process. Upper wafer assembly also has substantially identically spaced indentations or divides separated by sidewalls having the same selected spacing and orientation as for the lower wafer assembly described above.

The lower wafer assembly carries the $Rb^{87}$ segments in the divides. In a sealing step, the wax layers of the upper and lower wafer assemblies are heat sealed to one another at the wax's pre-defined softening temperature to ensure that the $Rb^{87}$ is completely enclosed by the wax layers of the upper and lower layered wafer assemblies.

The wafer-sandwich is then dipped in hydrofluoric acid (HF) to release the sealed, multi-segment wax enclosure from the silicon handlers. Chemical exposure to HF for extended intervals (e.g., overnight) shows no damage to the wax enclosure or the enclosed Rb87 segments. Finally, individual Rb-wax micropackets are formed by segmenting or dicing the wax enclosure to provide separate or individual Rb-wax micropackets, each containing a single Rb87 segment.

Alternative embodiments of the method are also possible to fabricate alkali metal-wax micropackets. Another simple method would be to evaporate a thin layer of wax directly on precise quantities of alkali metals or dip coating alkali metals by rapidly immersing in molten wax.

The use of alkali metal-wax micropackets to enclose alkali metals has the following advantages. First, it allows for the formation of pure alkali metal inside the final vapor cells. This is extremely important and currently the main limitation for the long term stability of CSACs. Second, it results in precise amounts of alkali metal needed for each type of vapor cell. This ensures reproducibility in the vapor cell performance and keeps the wastage of expensive alkali metals to a minimum. Third, the ease of fabrication and handling holds potential for inexpensive fabrication of CSAC vapor cells. The Rb-wax micropackets enable decoupling of MEMS fabrication for the rest of the vapor cell (such as cell fabrication, anodic bonding and buffer gas filling) from the stringent requirements of handling alkali metals. Additionally, for applications outside of CSAC, the use of Rb-wax micropackets provides an easy, inexpensive and safe way for packaging and transporting precise amounts of pure alkali metals.

A simple method of forming vapor cells using the Rb-wax micropackets begins with a substantially planar Pyrex wafer bonded to a low stress silicon ($Si_xN_y$) substrate. The wafer includes a plurality of spaced cavities formed by bulk-micromachining of the silicon and anodic bonding of the thermally matched Pyrex wafer in an ambient environment that contains the required composition and pressure of buffer gases.

A Rb-wax micropacket array is thermally bonded to the silicon nitride ($Si_xN_y$) membrane side of a wafer-scale cavity array and the enclosed Rb is released into the cavity by laser ablating the $Si_xN_y$membrane through the glass wafer. The laser used for ablation is mounted on an X-Y stage to precisely ablate the wax in each micropacket to release the Rb in a controllable way into the cavity. Laser ablation thus offers a fast and effective way of delivering precise amount of Rb into the vapor cells.

Laser ablation may be done using a Coherent™ 355 nm laser system, and for large ablation times (>5 sec), the wax is ablated all the way through and results in the Rb reacting immediately with the atmosphere. For ablation times of ~4 sec, the Rb is released and the wax forms a coating around the cavity. Although the effects of the wax wall coating remain unverified, one can conjecture that by carefully optimizing the ablation times and laser parameters, it is possible to form a thin uniform coating along the walls of the cavity that would result in increasing the coherence lifetimes of the alkali metals inside the vapor cells formed when using this process.

BRIEF DESCRIPTION OF THE DRAWINGS

The foregoing and additional features and advantages of the present invention will become apparent upon consideration of the following detailed description of a specific embodiment thereof, taken in conjunction with the accompanying drawings, wherein like reference numerals in the various figures are utilized to designate like components, in which:

FIG. 1*a* is a schematic diagram illustrating a preliminary step in the process for making Rb-wax micropackets, an $SiO_2$ layer is grown on a handler or wafer, a DRIE process is used to etch holes through the wafer, in accordance with the present invention;

FIG. 1*b* is a schematic diagram illustrating a second step in the process for making Rb-wax micropackets, a wax layer is deposited and divides or indentations are defined therein to receive Rb segments deposited with a micropipette, in accordance with the present invention;

FIG. 1*c* is a schematic diagram illustrating a third step in the process for making Rb-wax micropackets, a substantially identical upper wafer assembly is positioned over the lower wafer assembly carrying the Rb segments, and the two wafer assemblies are sealed together at wax softening temperature to enclose the Rb segments, in accordance with the present invention;

FIG. 1*d* is a schematic diagram illustrating a fourth step in the process for making Rb-wax micropackets, the now sealed wax enclosure is released from the wafer assemblies in an HF environment, in accordance with the present invention;

FIG. 2*a* is a schematic diagram illustrating a preliminary step in the process for making Rb vapor cells from Rb-wax micropackets, cavities are formed in the silicon substrate and an anodic bond to Pyrex is performed in a vacuum chamber with buffer gas, in accordance with the present invention;

FIG. 2*b* is a schematic diagram illustrating an intermediate step in the process for making Rb vapor cells from Rb-wax micropackets, wax-Rb micropackets are attached on the $Si_xN_y$membranes by heating the wax to softening temperature, in accordance with the present invention;

FIG. 2*c* is a schematic diagram illustrating a finishing step in the process for making Rb vapor cells from Rb-wax micropackets, a laser on an X-Y stage is used to ablate the $Si_xN_y$membrane and wax and then releases Rb into the cavity to form an Rb vapor cell, in accordance with the present invention;

DESCRIPTION OF THE PREFERRED EMBODIMENT

Figure 3A:
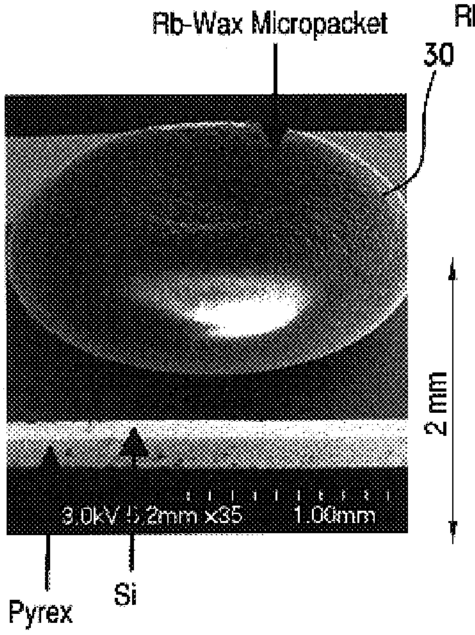
FIG. 3*a*, illustrates, a scanning electron microscope (SEM) view of a vapor cell formed using the processes of FIGS. 1*a*-2*c*, in accordance with the present invention.

Turning now to a more detailed description of the invention, the process for Alkali-Metal Wax Micropacket Fabrication, FIGS. 1*a*-1*d* schematically outline the sequence of process steps to form alkali metal wax micropackets.

Referring to FIG. 1*a*, a 1 μm thick layer of silicon dioxide ($SiO_2$) 10 is deposited on a 4-inch silicon wafer 12 used as a handle substrate. Through-wafer holes 14 are etched through handle substrate 12 using deep reactive ion etching (DRIE) on the back side to serve as etch holes for the release process.

A thin uniform layer of wax 16 is deposited on top of the $SiO_2$ layer 10 in the following way. The handling wafer 12 is placed on a hotplate with a level surface inside a nitrogen ambience glove box with low levels of oxygen and humidity within a few part per million. A measured amount of solid wax 16 is placed on the wafer 12, melted and spread using a microscope glass slide. The wafer is held above the melting point for a few minutes and rapidly cooled to ensure a uniform thickness (~0.25 mm) of the resulting wax layer 16. An array of pins is poked or pushed downwardly into the wax layer to indent, impress or form wax indentations, dimples or divides 18 after heating the wafer 12 to the wax softening temperature. The pins or other indenting members define evenly spaced dimples, indentations or divides 18 separated by sidewalls 19 having a selected spacing and orientation. The divides 18 are made using pogo pin array after the wax 16 is heated to the wax softening temperature. For example, if wax layer 16 is two mm thick, each dimple or divide 18 may be one to one and a half mm deep. The exact dimensions of the divide 18 is less critical since the wax will melt around the rubidium to sandwich it in the steps described below.

Precise amounts of liquid rubidium (e.g., $Rb^{87}$) are micropipetted onto the wax divides 18 using an X-Y-stage and a syringe pump to define a selected number of individual liquid $Rb^{87}$ segments or balls 20 as shown in FIG. 1*b*. The amount deposited is controlled using either micropipette or a syringe pump. Typical amounts are from 100 microliters (μl) to several milliliters (ml) (rubidium is molten when this volume is measured). In principle, one can use more precise micropipettes to handle tinier quantities of rubidium. The amount of rubidium that needs to be deposited depends on the application and the design of the vapor cell. One may control the quantity of liquid rubidium to be deposited precisely in this way. This is in contrast to bulk rubidium delivery methods where the amount of rubidium cannot be controlled tightly. The X-Y stage enables automation of the process (as against manually depositing the rubidium). The rubidium is micropippeted in a liquid state at a temperature at between 45 C. and 55 C. (the melting point of rubidium is 39 C.).

Turning now to FIG. 1*c*, a wax enclosure is formed by enclosing or sandwiching the $Rb^{87}$ segments 20 between upper and lower indented, wax layered wafers.

An upper indented, wax layered wafer assembly 22 also comprises a substantially identical silicon dioxide ($SiO_2$) layer 10 deposited on a 4-inch silicon handle wafer 12 that has a plurality of evenly spaced through-wafer holes (or vents or vias) 14 etched through using deep reactive ion etching (DRIE) on the back side to serve as etch holes for the release process. Upper wafer assembly also has substantially identically spaced indentations or divides 18 separated by sidewalls 19 having the same selected spacing and orientation as for the lower wafer assembly described above and identified (in FIGS. 1*b*and 1*c*) as 24.

The lower wafer assembly 24, as seen in FIG. 1*c*, carries the $Rb^{87}$ segments in the divides. In a sealing step, the wax layers of the upper and lower wafer assemblies are heat sealed to one another at the wax's pre-defined softening temperature to ensure that the $Rb^{87}$ is completely enclosed by the wax layers of the upper and lower layered wafer assemblies 22, 24.

The wafer-sandwich is then dipped in HF to release the sealed, multi-segment wax enclosure 26 from the silicon handlers 12, as best seen in FIG. 1*d*. Chemical exposure to HF for extended intervals (e.g., overnight) shows no damage to the wax enclosure 26 or the enclosed Rb87 segments 20. Finally, individual Rb-wax micropackets are formed by segmenting or dicing the wax enclosure 26 to provide separate Rb-wax micropackets 30.

Alternative embodiments of the method are also possible to fabricate alkali metal-wax micropackets. Another simple method would be to evaporate a thin layer of wax directly on precise quantities of alkali metals or dip coating alkali metals by rapidly immersing in molten wax.

The use of alkali metal-wax micropackets to enclose alkali metals has the following advantages. First, it allows for the formation of pure alkali metal inside the final vapor cells. This is extremely important and currently the main limitation for the long term stability of CSACs. Second, it results in precise amounts of alkali metal needed for each type of vapor cell. This ensures reproducibility in the vapor cell performance and keeps the wastage of expensive alkali metals to a minimum. Third, the ease of fabrication and handling holds potential for inexpensive fabrication of CSAC vapor cells. The Rb-wax micropackets 30 enable decoupling of MEMS fabrication for the rest of the vapor cell (such as cell fabrication, anodic bonding and buffer gas filling) from the stringent requirements of handling alkali metals. Additionally, for applications outside of CSAC, the use of Rb-wax micropackets is an easy, inexpensive and safe way for packaging and transporting precise amounts of pure alkali metals.

Once the micropackets 30 are made, all the processes occur at room temperature, and so the rubidium is in the solid phase.

A simple method of forming vapor cells using the Rb-wax micropackets is illustrated in FIGS. 2*a*-2*c*. First, as best seen in FIG. 2*a*, a substantially planar Pyrex wafer 40 is bonded with a low stress silicon ($Si_xN_y$) substrate 42. The wafer 40 includes a plurality of spaced cavities 44 formed by bulk-micromachining of the silicon 42 and anodic bonding of the thermally matched Pyrex wafer 40 in an ambient environment that contains the required composition and pressure of buffer gases.

As best seen in FIG. 2*b*, a Rb-wax micropacket array 48 is thermally bonded to the silicon nitride ($Si_xN_y$) membrane side 42 of a wafer-scale cavity array. The enclosed Rb 20 is released into the cavity 44 by laser ablating the $Si_xN_y$membrane 42 through the glass wafer 40. The laser 50 used for ablation is mounted on an X-Y stage to precisely ablate the wax in each micropacket 30 so as to release the Rb in a controllable way. Laser ablation thus offers a fast and effective way of delivering precise amount of Rb into the vapor cells 52.

The time history for laser ablation using a Coherent™ 355 nm laser system is shown in Table 1. For large ablation times (>5 sec), the wax is ablated all the way through and results in the Rb to react immediately with the atmosphere. For ablation times of ~4 sec, the Rb is released and the wax forms a coating around the cavity. Although we have not verified the effects of the wax wall coating, we can conjecture that by carefully optimizing the ablation times and laser parameters, it is possible to form a thin uniform coating along the walls of the cavity that would result in increasing the coherence lifetimes of the alkali metals inside the vapor cells formed using this process.

TABLE 1

Time history of laser ablation and its effects. Parameters of Coherent 355 nm laser system with 20 A laser current: Pulse rate 15 kHz, Energy = 110 μJ

| Time (sec) | Cell Status |
|---|---|
| 2-3 | Rb released, no wax coating. |
| 4 | Rb released, cell coated with wax. |
| >5 | Wax drilled through, Rb reacts to form RbOH and $Rb_2O$. |

The correct specification of the ambient environment should include the composition of the gases used and the total pressure at a given temperature. A typical ambient condition used in vapor cells in CSAC is neon gas or argon gas at 10 torr of pressure at 25 degree C. In the exemplary embodiment xenon gas is used at 10 torr pressure. Again, this may vary from sub-milli-torr pressure to several 10s of torrs of pressure, depending on the design of the vapor cell for use in specific CSACs.

The quantity or amount of Rb released into the cell has not been measured or controlled as of this writing, but a current estimate is that more than 90% of the rubidium segment 20 in the wax packet 30 is released into the cavity 44 of the vapor cell 52 as a result of the ablation process step.

Figure 3B:
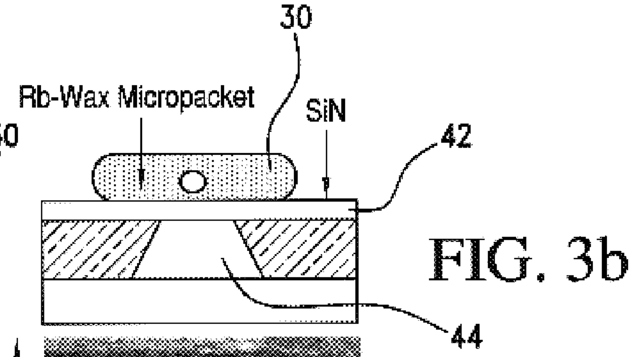
FIG. 3*b* schematically illustrates, in cross section, a $Si_xN_y$membrane supporting or carrying an adhered Rb-wax micropacket positioned adjacent the cavity positioned to form an Rb vapor cell, in accordance with the present invention.
Figure 3C:
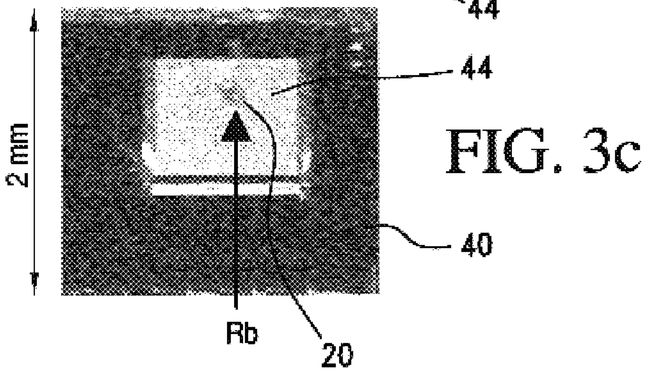
FIG. 3*c* illustrates, photographically, from the Pyrex side, an Rb vapor cell showing the Rb, in accordance with the present invention.
Figure 4A:
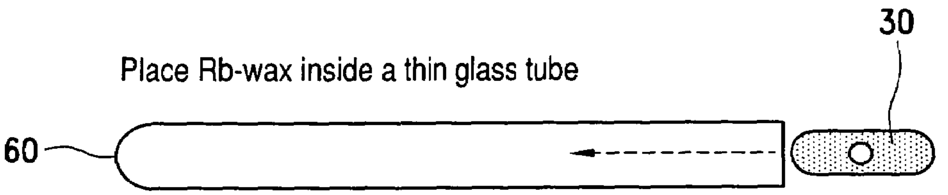
FIG. 4*a* is a schematic diagram illustrating a preliminary step in the process for making Rb vapor cells from Rb-wax micropackets enclosed in glass tube, a wax-Rb micropacket is inserted into the hollow interior or lumen of a thin glass tube, in accordance with the present invention.
Figure 4B:
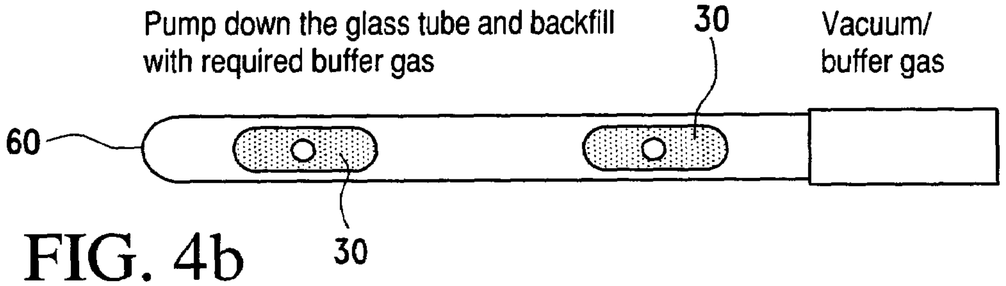
FIG. 4*b* is a schematic diagram illustrating a next step in the process for making Rb vapor cells from Rb-wax micropackets enclosed in glass tube, the glass tube is pumped down and backfilled with buffer gas, in accordance with the present invention.
Figure 4C:
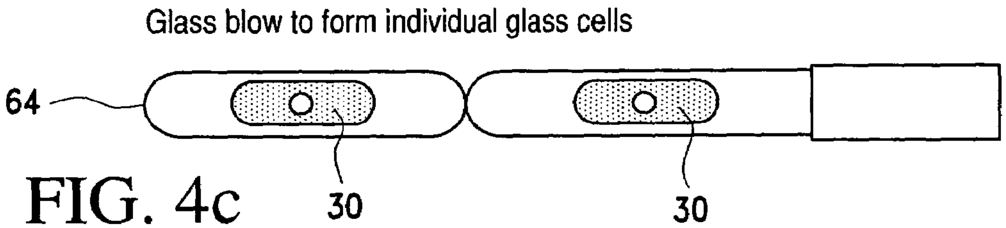
FIG. 4*c* is a schematic diagram illustrating a next step in the process for making Rb vapor cells from Rb-wax micropackets enclosed in glass tube, the glass tube is segmented or glass blown to form individual glass cells with each cell enclosing a single wax-Rb micropacket, in accordance with the present invention.
Figure 4D:
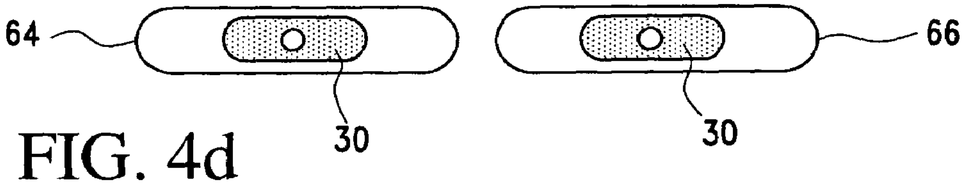
FIG. 4*d* is a schematic diagram illustrating individual glass cells made using the process steps of FIGS. 4*a*-4*c*, with each cell enclosing a single wax-Rb micropacket, in accordance with the present invention.

FIG. 3*a* shows an SEM of a vapor cell 52 fabricated using Rb-wax micropackets 30. FIG. 3*b*(i) shows a schematic cross sectional view and FIG. 3*b*(ii) is a photograph of a vapor cell 30 from the Pyrex side.

The vapor cells (e.g., 30) may range from 1 mm×1 mm×500 microns (length×width ×height) to 5 mm×5 mm×1 mm. The cavities are defined in silicon using silicon micromachining but are enclosed using Pyrex.

Alternative embodiments include other methods of forming vapor cells fabricated using alkali-metal wax micropackets 30 that are suitable for use in CSACs. One method is to enclose the alkali metal-wax micropacket 30 inside a thin glass tube 60 or hollow core fibers as shown in FIGS. 4*a*-4*d*. This process is simpler than methods without the use of wax micropackets 30, since as the glass vapor cells can be formed by pumping down and backfilling with the required buffer gas pressure and composition. Individual cells 64, 66 are readily isolated by glass blowing (or laser fusing).

Figure 5:
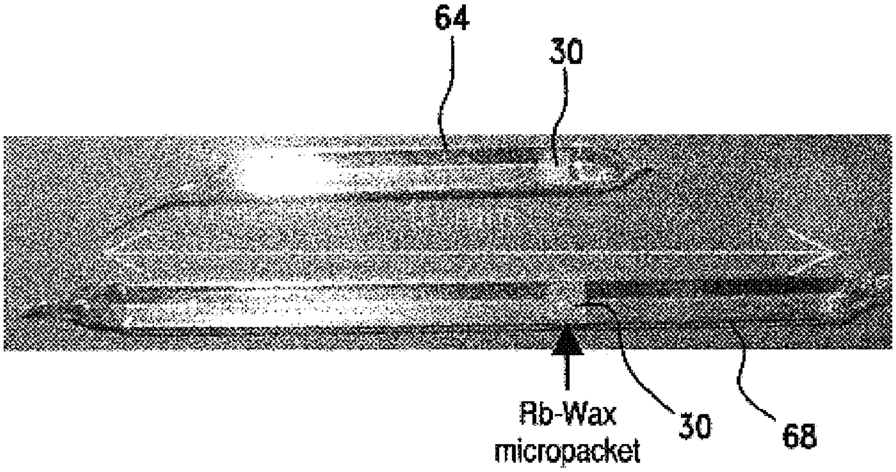
FIG. 5 is a photograph illustrating first and second exemplary individual glass cells made using the process steps of FIGS. 4*a*-4*c*, with each cell enclosing a wax-Rb micropacket, in accordance with the present invention.

FIG. 5 shows vapor cells 64, 68 enclosing $Rb^{87}$-wax micropackets 30 within buffer gas at a pressure of 10 torr. The cells 64, 68 shown in FIG. 5 have a total volume of between three and six cubic mm.

It will be appreciated by those having skill in these arts that the present invention makes available a method of making alkali-metal vapor cells by first forming microscale-wax micropackets with alkali metals inside. This invention allows fabrication of vapor cells at low cost and in a batch fabricated manner. The method reduces the cost of making chip-scale atomic clocks and allows shipping of alkali vapor packets without contamination issues, thereby creating a technology for alkali-metal vendors to provide small packets of alkali metals.

Having described preferred embodiments of a new and improved method, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A method for forming alkali-metal vapor cells, comprising the method steps of:

(a) providing an alkali metal segment;

(b) forming a wax covered micropacket enveloping said alkali metal segment and sealing said metal segment inside the wax micropacket's outer surface.

2. The method of claim 1, further including:

(c) providing a substrate made from a silicon-containing compound;

(d) forming at least one cavity in said substrate;

(e) bonding said substrate to a top cover; and (f) attaching the micropacket to a bottom surface of the substrate in alignment with the cavity.

3. The method of claim 2, further including:

(g) positioning a laser over selected cavities; and (h) ablating a selected micropacket through its corresponding cavity with a beam from said laser.

4. The method of claim 1, further including:

(c) providing a solid, gas impermeable tube segment made from a silicon-containing compound, said tube having a hollow interior or lumen;

(d) inserting the micropacket into said tube lumen and sealing the micropacket into the tube segment.

5. The method of claim 1, wherein step (b), forming a wax covered micropacket with said alkali metal segment inside the wax micropacket's outer surface, comprises the following method steps:

(b1) providing a first silicon wafer or substrate handler;

(b2) etching a plurality of holes or vias through said wafer;

(b3) Applying or growing an $SiO_2$ layer onto a selected surface of said wafer;

(b4) depositing a wax layer onto said $SiO_2$ layer;

(b5) adjusting the temperature of said wax layer to the wax-softening temperature for said wax layer to provide a soft wax surface;

(b6) impressing an indentation into said wax surface; and (b7) depositing or placing a segment of alkali metal into said indentation.

6. The method of claim 5, wherein step (b) further comprises the following method steps:

(b8) providing a second silicon wafer or substrate handler;

(b9) etching a plurality of holes or vias through said second wafer;

(b10) Applying or growing an $SiO_2$ layer onto a selected surface of said second wafer;

(b11) depositing a wax layer onto said second wafer's $SiO_2$ layer;

(b12) adjusting the temperature of said second wafer's wax layer to the wax-softening temperature for said wax layer to provide a soft wax surface;

(b13) impressing an indentation into said second wafer's wax surface;

(b14) placing said first and second wafers in a parallel juxtaposition with the indentations of the first wafer aligned with the indentations of the second wafer;

(b15) adjusting the temperature of said first and second wafers to a temperature near the wax softening temperature; and (b16) sealing said first wafer's wax layer to said second wafer's wax layer, thereby encapsulating said segment of alkali metal within a wax covering.

7. The method of claim 6, wherein step (b) further comprises the following method steps:

(b17) releasing said wax encapsulated segment of alkali from said first and second wafers to form a wax covered micropacket.

8. The method of claim 1, wherein step (b), forming a wax covered micropacket with said alkali metal segment inside the wax micropacket's outer surface, comprises evaporating a layer of wax directly onto the outer surface of an alkali metal segment.

9. The method of claim 1, wherein step (b), forming a wax covered micropacket with said alkali metal segment inside the wax micropacket's outer surface, comprises dip coating an alkali metal segment by rapid immersion in molten wax.

10. The method of claim 1, wherein step (f) bonding said substrate to a top cover, comprises anodically bonding said substrate to a low-stress $Si_xN_y$membrane in a vacuum chamber.

11. A method for making a transportable and stable encapsulated alkali metal segment having a selected mass of alkali metal, comprising:

(a) providing a gas and moisture impermeable receptacle including a supportive surface adapted to receive the alkali metal segment, said receptacle being made from a substantially inert malleable material;

(b) dispensing a selected quantity of liquid alkali metal into said receptacle using a pipette or a similar liquid dispensing instrument adapted to precisely control the quantity of liquid metal dispensed;

(c) allowing said liquid alkali metal to cool, whereupon the phase of the metal changes and said liquid metal solidifies into a solid alkali metal segment; and (d) encapsulating said selected quantity of liquid alkali metal in a gas and moisture impermeable covering that is compatible with said receptacle's substantially inert malleable material.

12. The method of claim 11, wherein step (a), providing a gas and moisture impermeable receptacle including a supportive surface adapted to receive the alkali metal segment, comprises:

(a1) providing a first silicon wafer or substrate handler;

(a2) etching a plurality of holes or vias through said wafer;

(a3) Applying or growing an $SiO_2$ layer onto a selected surface of said wafer;

(a4) depositing a wax layer onto said $SiO_2$ layer;

(a5) adjusting the temperature of said wax layer to the wax-softening temperature for said wax layer to provide a soft wax surface;

(a6) impressing an indentation into said wax surface.

13. The method of claim 11, wherein step (d), encapsulating said selected quantity of liquid alkali metal in a gas and moisture impermeable covering, comprises:

(d1) providing a second silicon wafer or substrate handler;

(d2) etching a plurality of holes or vias through said second wafer;

(d3) Applying or growing an $SiO_2$ layer onto a selected surface of said second wafer;

(d4) depositing a wax layer onto said second wafer's $SiO_2$ layer;

(d5) adjusting the temperature of said second wafer's wax layer to the wax-softening temperature for said wax layer to provide a soft wax surface;

(d6) impressing an indentation into said second wafer's wax surface;

(d7) placing said first and second wafers in a parallel juxtaposition with the indentations of the first wafer aligned with the indentations of the second wafer;

(d8) adjusting the temperature of said first and second wafers to a temperature near the wax softening temperature; and (d9) sealing said first wafer's wax layer to said second wafer's wax layer, thereby encapsulating said segment of alkali metal within a wax covering.

14. The method of claim 11, wherein step (b), dispensing a selected quantity of liquid alkali metal, comprises dispensing liquid rubidium (Rb) at a dispensing temperature greater than 39 degrees Celsius.

15. The method of claim 11, wherein step (b), dispensing a selected quantity of liquid alkali metal, comprises dispensing liquid $Rb^{87}$ at a dispensing temperature between 45 degrees Celsius and 55 degrees Celsius.

16. A gas and moisture impermeable micropacket or carrier adapted to preserve and transport an alkali metal segment, comprising:

a segment of alkali metal; and an encapsulating outer coating of wax completely enveloping and sealing said segment of alkali from air or other reactive environments.

17. The micropacket of claim 16, wherein said wax is formulated to receive and support said alkali metal when said alkali metal is dispensed in a liquid state and at a temperature greater than 39 degrees Celsius.

18. The micropacket of claim 17, wherein said alkali metal is dispensed in a liquid state in an amount within the range of 100 microliters (μl) to several milliliters (ml). (rubidium is molten when this volume is measured).

19. The micropacket of claim 16, wherein said alkali metal is rubidium.

20. The micropacket of claim 19, wherein said alkali metal is $Rb^{87}$.

* * * * *